(12) United States Patent
Ren et al.

(10) Patent No.: US 11,049,994 B2
(45) Date of Patent: Jun. 29, 2021

(54) LIGHT EMITTING DIODES WITH N-POLARITY AND ASSOCIATED METHODS OF MANUFACTURING

(71) Applicant: Micron Technology, Inc., Boise, ID (US)

(72) Inventors: Zaiyuan Ren, Boise, ID (US); Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/631,836

(22) Filed: Jun. 23, 2017

(65) Prior Publication Data

US 2017/0288089 A1 Oct. 5, 2017

Related U.S. Application Data

(62) Division of application No. 12/714,262, filed on Feb. 26, 2010, now Pat. No. 9,705,028.

(51) Int. Cl.
*H01L 33/00* (2010.01)
*H01L 33/16* (2010.01)
*H01L 33/32* (2010.01)

(52) U.S. Cl.
CPC ...... *H01L 33/0025* (2013.01); *H01L 33/0075* (2013.01); *H01L 33/16* (2013.01); *H01L 33/32* (2013.01)

(58) Field of Classification Search
CPC ..... H01L 33/0025; H01L 33/16; H01L 33/32; H01L 33/0075
USPC .......................................................... 257/94
See application file for complete search history.

(56) References Cited

U.S. PATENT DOCUMENTS

| | | | |
|---|---|---|---|
| 5,425,811 A | 6/1995 | Mashita | |
| 6,099,945 A | 8/2000 | Yokoyama et al. | |
| 6,176,925 B1 | 1/2001 | Solomon et al. | |
| 6,323,053 B1 | 11/2001 | Nishikawa et al. | |
| 6,391,748 B1 | 5/2002 | Temkin et al. | |
| 7,497,963 B2 | 3/2009 | Lee et al. | |
| 7,566,580 B2 | 7/2009 | Keller et al. | |

(Continued)

FOREIGN PATENT DOCUMENTS

| | | |
|---|---|---|
| JP | H11-074199 A | 3/1999 |
| JP | 2002110569 A | 4/2002 |

(Continued)

OTHER PUBLICATIONS

Office Action dated Jun. 9, 2015 in Korea Application No. 10-2012-7025133, 14 pages.

(Continued)

*Primary Examiner* — Samuel A Gebremariam
(74) *Attorney, Agent, or Firm* — Perkins Coie LLP

(57) ABSTRACT

Light emitting diodes ("LEDs") with N-polarity and associated methods of manufacturing are disclosed herein. In one embodiment, a method for forming a light emitting diode on a substrate having a substrate material includes forming a nitrogen-rich environment at least proximate a surface of the substrate without forming a nitrodizing product of the substrate material on the surface of the substrate. The method also includes forming an LED structure with a nitrogen polarity on the surface of the substrate with a nitrogen-rich environment.

11 Claims, 6 Drawing Sheets

(56) References Cited

U.S. PATENT DOCUMENTS

| | | |
|---|---|---|
| 7,955,646 B2 | 6/2011 | Cruse et al. |
| 8,334,155 B2 | 12/2012 | Krames et al. |
| 2001/0006840 A1 | 7/2001 | Takahashi |
| 2004/0108500 A1 | 6/2004 | Yoshikawa et al. |
| 2005/0184299 A1* | 8/2005 | Matsumura ....... H01L 21/28575 257/79 |
| 2007/0042560 A1 | 2/2007 | Sumiya et al. |
| 2007/0075320 A1* | 4/2007 | Hata ...................... B82Y 20/00 257/79 |
| 2009/0085065 A1* | 4/2009 | Mishra .................. H01L 21/187 257/194 |
| 2009/0087936 A1 | 4/2009 | Miki et al. |
| 2009/0101935 A1 | 4/2009 | Sugawara |
| 2009/0236586 A1 | 9/2009 | Chen et al. |
| 2009/0246944 A1 | 10/2009 | Keller et al. |
| 2010/0046567 A1 | 2/2010 | Lillienthal-Weber et al. |
| 2010/0199914 A1 | 8/2010 | Iza |
| 2011/0008924 A1 | 1/2011 | Yang et al. |

FOREIGN PATENT DOCUMENTS

| | | |
|---|---|---|
| JP | 2002289915 | 10/2002 |
| JP | 2005277342 | 10/2005 |
| JP | 2006135001 | 5/2006 |
| JP | 2007157765 | 6/2007 |
| TW | 200417092 | 9/2004 |

OTHER PUBLICATIONS

Office Action dated Jul. 10, 2015 in Chinese Application No. 201180018207.6, 4 pages.

Feezell, D.F. et al., Development of Nonpolar and Semipolar InGaN/GaN Visible Light-Emitting Diodes, MRS Bulletin, vol. 34, pp. 318-323, May 2009.

International Search Report and Written Opinion dated Oct. 25, 2011 in Application No. PCT/US2011/026192, 7 pages.

Office Action dated May 23, 2013 in Taiwan Application No. 100106518, 7 pages.

Office Action dated Oct. 29, 2013 in Japan Application No. 2012-555176, 6 pages.

Office Action dated Oct. 30, 2013 in Korea Application No. 10-2012-7025133, 6 pages.

Office Action dated Apr. 25, 2016 in Korea Application No. 10-2012-7025133, 6 pages.

Office Action dated Mar. 15, 2016 in China Application No. 201180018207, 6 pages.

* cited by examiner

LIGHT EMITTING DIODES WITH N-POLARITY AND ASSOCIATED METHODS OF MANUFACTURING

CROSS-REFERENCE TO RELATED APPLICATIONS

This application is a divisional of U.S. application Ser. No. 12/714,262 filed Feb. 26, 2010, now U.S. Pat. No. 9,705,028, which is incorporated herein by reference in its entirety.

TECHNICAL FIELD

The present technology is directed generally to solid state lighting (SSL) devices, such as light emitting diodes ("LEDs"), and associated methods of manufacturing.

BACKGROUND

Mobile phones, personal digital assistants (PDAs), digital cameras, MP3 players, and other portable electronic devices utilize LEDs for background illumination. FIG. 1 is a cross-sectional diagram of a portion of a conventional indium-gallium nitride ("InGaN") LED 10. As shown in FIG. 1A, the LED 10 includes a substrate 12, an optional buffer material 13 (e.g., aluminum nitride), an N-type gallium nitride ("GaN") material 14, an InGaN material 16 (and/or GaN multiple quantum wells), and a P-type GaN material 18 on top of one another in series. The LED 10 also includes a first contact 20 on the P-type GaN material 18 and a second contact 22 on the N-type GaN material 14.

The LED 10 should be configurable to emit at a wide range of wavelengths. It is believed that the wavelength at which the LED 10 emits is at least partially related to the amount of indium (In) in the InGaN material 16. For example, a larger amount of indium in the InGaN material 16 has been associated with longer emission wavelengths of the LED 10.

One technique for enhancing the incorporation of indium in the InGaN material 16 is to form the GaN/InGaN materials 14, 16, and 18 on nitrogen-polarity surfaces rather than on gallium-polarity surfaces via nitrodizing the substrate 12. However, one operational difficulty of this technique is that the nitrodizing product of the substrate 12 may interfere with subsequent deposition of the GaN/InGaN materials 14, 16, and 18 thereon. Thus, several improvements in forming LED structures on nitrogen-polarity surfaces of substrates may be desirable.

DETAILED DESCRIPTION

Various embodiments of microelectronic substrates having LEDs formed thereon and associated methods of manufacturing are described below. The term "microelectronic substrate" is used throughout to include substrates upon which and/or in which microelectronic devices, micromechanical devices, data storage elements, read/write components, and other features are fabricated. The term "silicon" generally refers to a single crystalline silicon material having a face-centered diamond cubic structure with a lattice spacing of 5.430710 Å. The term "silicon (1,0,0)" and the term "silicon (1,1,1)" generally refer to crystal lattice orientations of (1,0,0) and (1,1,1) as defined by the Miller index, respectively. A discussion of the Miller index can be found in the *Handbook of Semiconductor Silicon Technology* by William C. O'Mara, the disclosure of which is incorporated herein in its entirety. A person skilled in the relevant art will also understand that the technology may have additional embodiments, and that the technology may be practiced without several of the details of the embodiments described below with reference to FIGS. 2A-5.

In the following discussion, an LED having GaN/InGaN materials is used as an example of an LED in accordance with embodiments of the technology. Several embodiments of the LEDs may also include at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials. The foregoing semiconductor materials may have generally similar or different crystal structures than GaN/InGaN materials. However, the following definition of Ga-polarity and N-polarity may still apply.

Figure 1A:
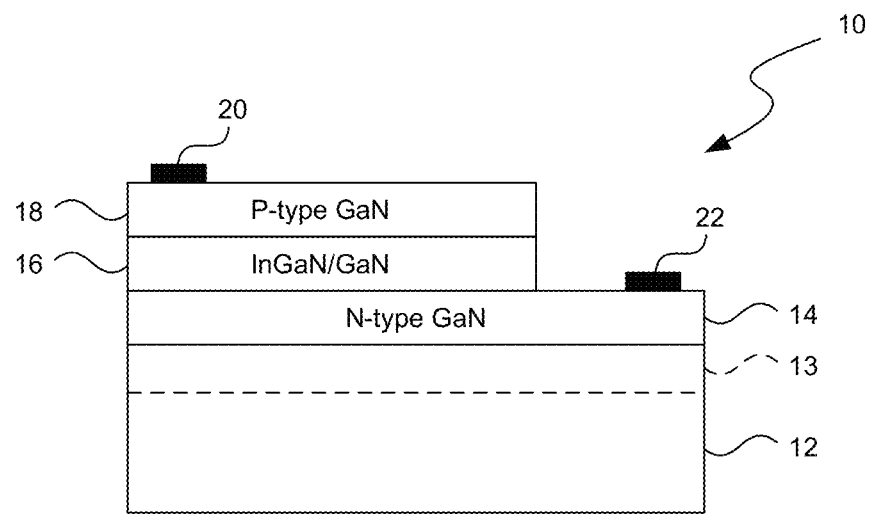
FIG. 1A is a cross-sectional view of a portion of an LED in accordance with the prior art.
Figure 1B:
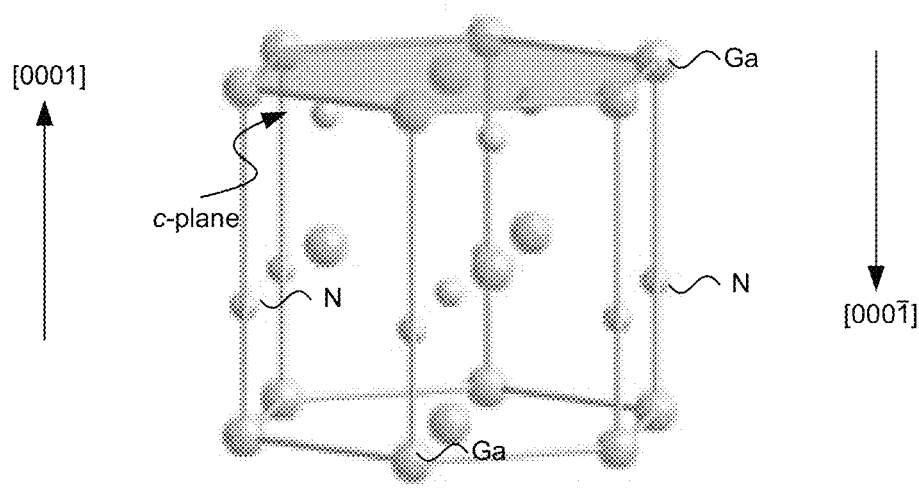
FIG. 1B is a schematic perspective view of a crystal plane in a GaN/InGaN material in accordance with embodiments of the technology.

FIG. 1B is a schematic perspective view of a crystal plane in a GaN/InGaN material in accordance with embodiments of the technology. As shown in FIG. 1B, the GaN/InGaN material has a wurtzite crystal structure with various lattice planes or facets as represented by corresponding Miller indices. One such lattice plane, the c-plane, is illustrated in FIG. 1B. As used hereinafter, the term "Ga-polarity" generally refers to a lattice structure extending along a direction generally perpendicular to the c-plane and with a Miller index of [0001]. The term "N-polarity" generally refers to a lattice structure extending along the opposite direction with a Miller index of [000$\bar{1}$].

Figure 2:
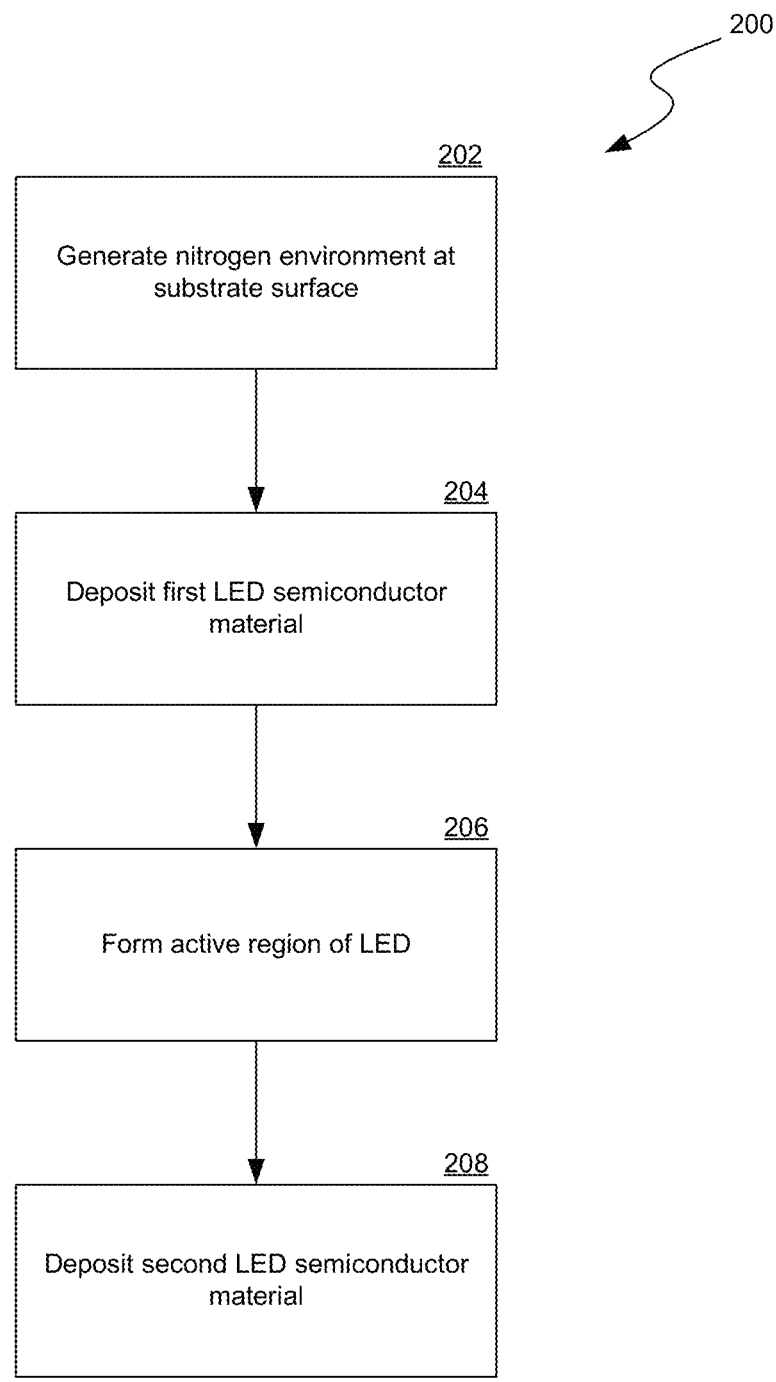
FIG. 2 is a flow diagram illustrating a method for forming an LED structure with N-polarity in accordance with embodiments of the technology.

FIG. 2 is a flow diagram illustrating a method 200 of forming an LED structure with N-polarity in accordance with embodiments of the technology. As shown in FIG. 2, an initial stage of the method (block 202) includes generating a nitrogen-rich environment at least proximate a surface of a substrate without forming a nitride material on the surface of the substrate. In the following description, the substrate includes a silicon wafer with a (1,1,1) crystal lattice orientation for illustration purposes. In other embodiments, the substrate can also include a silicon wafer with a (1,0,0) crystal lattice orientation. In further embodiments, the substrate can include a silicon wafer with other crystal lattice orientations, or it can include silicon carbide (SiC), sapphire ($Al_2O_3$), and/or other suitable substrate materials.

One feature of the generated nitrogen-rich environment at the surface of the substrate is that the nitrogen (N) atoms may be loosely adsorbed on, diffused into, and/or otherwise attached to the surface of the silicon wafer without forming covalent bonds, ionic bonds, and/or having other strong interactions with the silicon material. As used hereinafter, the phrase "strong interaction" generally refers to a molecular interaction with an interaction energy of more than about 50 kcal/mol.

Instead, in certain embodiments, the nitrogen atoms may be adsorbed onto the surface of the silicon wafer via Van der Waals forces, hydrogen bonds, and/or other weak interactions. As used hereinafter, the phrase "weak interaction" generally refers to a molecular interaction with an interaction energy of less than about 10.0 kcal/mol. For example, the nitrogen atoms may be attached to the surface of the silicon wafer via Van der Waals forces or hydrogen bonds with an interaction energy of about 10.0 kcal/mol, 5 kcal/mol, 1 kcal/mol, and/or with other suitable values of interaction energy. In another embodiment, the nitrogen atoms may be diffused into the silicon wafer. The diffused nitrogen atoms may be contained or trapped in the lattice structure of the silicon wafer without forming silicon nitride (SiN) crystal structures. In further embodiments, the nitrogen atoms may be otherwise loosely attached to the substrate via other suitable mechanisms.

In certain embodiments, generating the nitrogen-rich environment can include applying nitrogen plasma from which a plurality of nitrogen atoms attach to the surface of the silicon wafer, and controlling the parameters of the nitrogen plasma to avoid forming silicon nitride (SiN) and/or other nitrodizing products on the surface of the silicon wafer. Several embodiments utilizing the application of nitrogen plasma are described in more detail below with reference to FIGS. 3A-3C.

In other embodiments, generating the nitrogen-rich environment can include depositing silicon nitride (SiN) and/or other nitrodizing products on the surface of the silicon wafer, diffusing at least some of the nitrogen atoms from the silicon nitride (SiN) into the silicon wafer, and subsequently removing the deposited silicon nitride (SiN) from the surface of the silicon wafer before forming LED structures thereon. Several embodiments utilizing the diffusion of nitrogen atoms into the silicon wafer are described in more detail below with reference to FIGS. 4A-4D. In further embodiments, generating the nitrogen-rich environment can include contacting the surface of the silicon wafer with other suitable nitrogen-containing compositions.

After the nitrogen-rich environment is generated, the method can then include several stages of forming an LED structure on the surface of the silicon wafer. For example, another stage of the method (block 204) can include depositing a first semiconductor material on the silicon wafer that has the nitrogen-rich environment at least proximate the surface of the silicon wafer. In one embodiment, depositing the first semiconductor material includes growing an epitaxial N-type GaN material on the surface of a silicon wafer. In other embodiments, depositing the first semiconductor material may include growing a P-type GaN material and/or other suitable cladding materials on the surface of the silicon wafer.

A further stage of the method (block 206) can include forming an active region of the LED on the first semiconductor material. In one embodiment, forming the active region includes growing an epitaxial InGaN material and/or forming GaN multiple quantum wells on the N-type GaN material grown on the surface of the substrate. In other embodiments, forming the active region can include growing other types of suitable semiconductor material on the first semiconductor material.

Yet another stage of the method (block 208) can include forming a second semiconductor material on the active region. In one embodiment, depositing the second semiconductor material includes growing an epitaxial P-type GaN material on the active region of the LED. In other embodiments, depositing the second semiconductor material may also include growing an N-type GaN material and/or other suitable cladding materials. Techniques for growing the first semiconductor material, the active region, and the second semiconductor material can include metal-organic chemical vapor deposition ("MOCVD"), molecular beam epitaxy ("MBE"), liquid phase epitaxy ("LPE"), hydride vapor phase epitaxy ("HVPE"), and/or other suitable techniques.

It is believed that the nitrogen-rich environment at the surface of the silicon wafer can at least facilitate the growth of GaN/InGaN materials with N-polarity instead of the Ga-polarity for the LED structure. Without being bound by theory, it is believed that the nitrogen atoms at least proximate the surface of the silicon wafer can influence and/or determine the polarity of an electrical and/or electromagnetic field at the surface of the silicon wafer. As a result, gallium (Ga) and/or indium (In) atoms would preferentially form GaN and/or InGaN lattice structures with the N-polarity instead of the Ga-polarity.

It is also believed that the formed LED structure can have improved lattice quality over prior art LED structures because no silicon nitride (SiN) is formed on the surface of the silicon wafer. Without being bound by theory, it is believed that if silicon nitride (SiN) is formed on the surface of the silicon wafer, precursors for forming the GaN and/or InGaN materials (e.g., trimethylgallium, triethylgallium, trimethylindium, triethylindium, di-isopropylmethylindium, ethyldimethylindium, etc.) may not adequately wet the surface of the silicon wafer. As a result, it may be difficult for the GaN/InGaN precursors to nucleate on the surface of the silicon wafer. The formed LED structure thus would have high dislocation rates, rough surfaces, and/or other poor lattice qualities. Accordingly, by not forming silicon nitride (SiN) on the surface of the silicon wafer, the GaN/InGaN precursors may readily nucleate on the surface of the silicon wafer to yield improved lattice qualities for the formed LED structure.

Even though the method 200 is described above as forming the LED structure directly on the surface of the silicon wafer, in certain embodiments the method 200 can also include optionally depositing a buffer material onto the surface of the silicon wafer before forming the LED structure. In one embodiment, the buffer material can include aluminum nitride (AlN) formed by contacting the surface of the silicon wafer with a gas containing trimethylaluminum (TMAl), ammonia ($NH_4OH$), and/or other suitable compositions. In other embodiments, the buffer material can also include zinc oxide ($ZnO_2$) and/or other suitable buffer materials formed on the surface of the silicon wafer via MOCVD, MBE, and/or other suitable techniques.

Figure 3A:
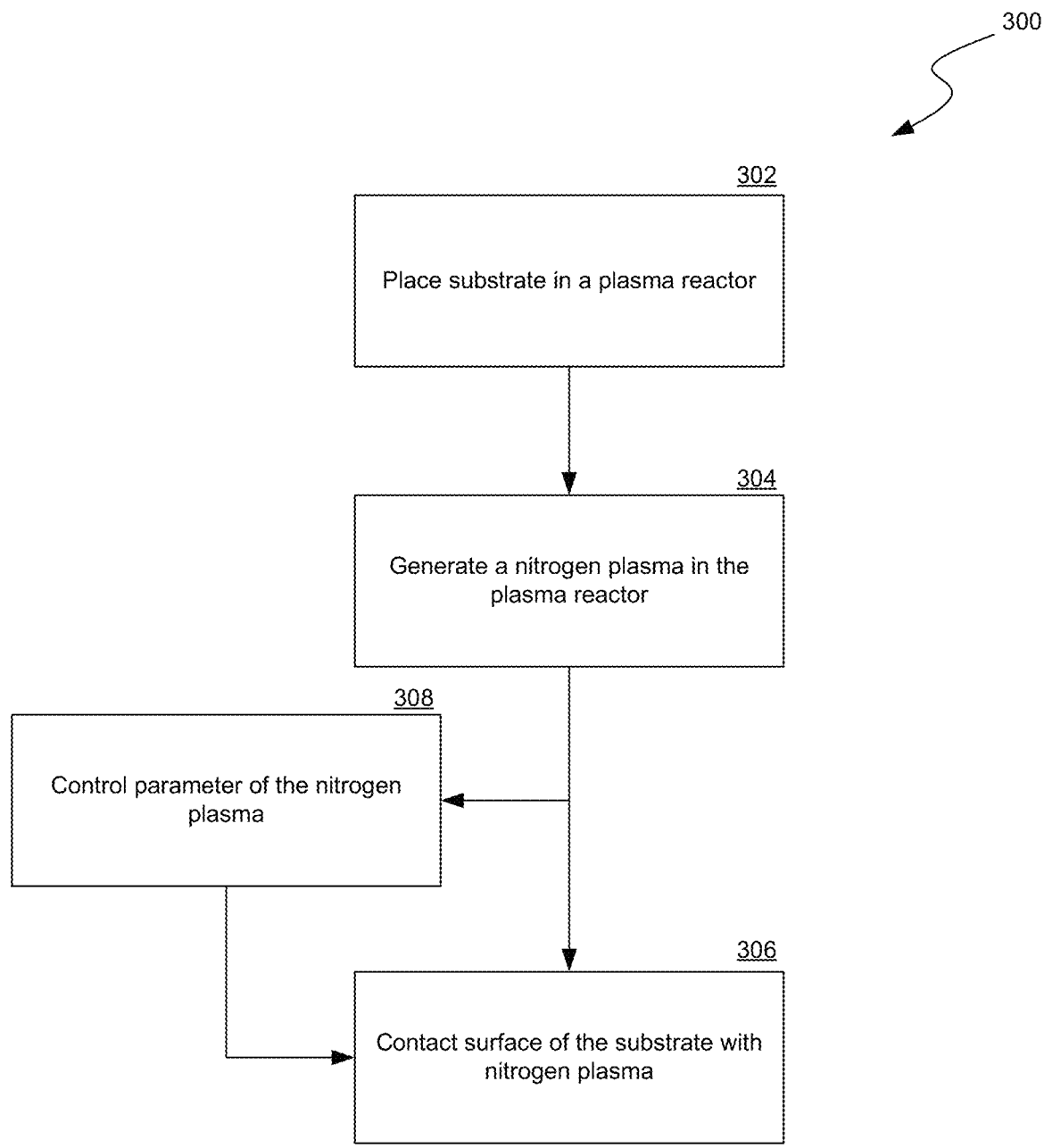
FIG. 3A is a flow diagram illustrating a procedure for generating a nitrogen-rich environment at a substrate surface in accordance with embodiments of the technology.

FIG. 3A is a flow diagram illustrating a procedure 300 for generating a nitrogen-rich environment at least proximate a surface of a silicon wafer in accordance with embodiments of the technology. As shown in FIG. 3A, the procedure 300 can include an initial stage (block 302) of placing a silicon wafer in a plasma reactor and/or other suitable types of reactors. One example of a plasma reactor is discussed below in more detail with reference to FIG. 3B.

Another stage of the procedure 300 (block 304) includes generating nitrogen plasma in the plasma chamber. In one embodiment, generating nitrogen plasma includes injecting a gas containing nitrogen into the plasma chamber, and applying energy to the injected gas to generate the nitrogen plasma in the plasma chamber. Techniques for applying energy include electrostatic biasing, radio frequency ("RF") radiating, and/or other suitable techniques. In another embodiment, the nitrogen plasma may be generated by a remote plasma source and may be directed to the plasma chamber with a plasma guide. In further embodiments, the nitrogen plasma may be generated via other suitable techniques.

A subsequent stage of the procedure 300 (block 306) includes applying the generated plasma to the surface of the silicon wafer. While applying the nitrogen plasma to the surface of the silicon wafer, another stage of the procedure 300 (block 308) includes adjusting at least one parameter of generating and/or applying the nitrogen plasma such that the generated nitrogen plasma does not cause silicon nitride (SiN) to be formed on the surface of the silicon wafer.

In one embodiment, a plasma sensor can continuously measure at least one plasma parameter (e.g., a plasma charge density and/or a plasma temperature) of the generated plasma. A computer-based controller may then use the monitored plasma parameter as a process variable in a feedback-control loop for achieving a desired setpoint of plasma energy. The setpoint of the plasma energy may be empirically and/or theoretically determined such that the nitrogen plasma does not have sufficient energy to cause formation of silicon nitride (SiN) on the surface of the silicon wafer. Control variables for the feedback-control loop may include electrical biasing voltage, RF intensity, thermal input to the plasma chamber and/or the silicon wafer, and/or other suitable operating conditions. In other embodiments, other suitable techniques and/or operating parameters of the generated plasma may be used.

Figure 3B:
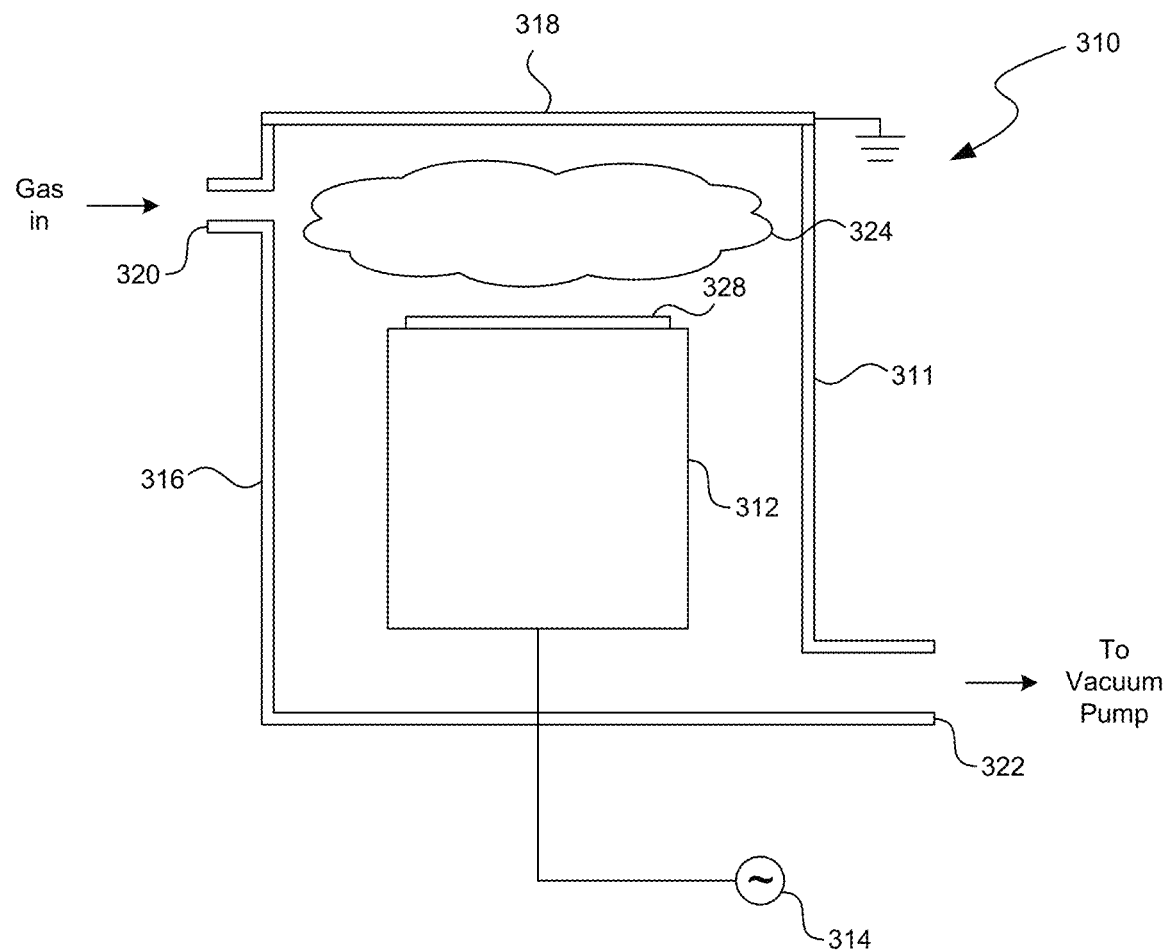
FIG. 3B is a schematic diagram illustrating a plasma reactor useful for performing the procedure of FIG. 3A in accordance with embodiments of the technology.

FIG. 3B is a schematic diagram illustrating a plasma reactor 310 useful for performing the procedure 300 of FIG. 3A in accordance with embodiments of the technology. As shown in FIG. 3B, the plasma reactor 310 includes a chamber 311, a support 312 inside the chamber 311, and a power source 314 electrically coupled to the support 312. The chamber 311 includes a vessel 316 coupled to an electrically grounded lid 318 to form a sealed environment inside the chamber 311. The chamber 311 also includes a gas inlet 320 proximate to an upper portion of the vessel 316 and a gas outlet 322 proximate to a bottom portion of the vessel 316. The plasma reactor 310 can also include a vacuum pump (not shown) coupled to the gas outlet 322 for evacuating gases from the chamber 311.

In operation, a gas containing nitrogen enters the chamber 311 via the gas inlet 320. The power source 314 creates a bias voltage between the support 312 and the lid 318 to establish and/or to maintain plasma 324 between the lid 318 and a silicon wafer 328 held on the support 312. The plasma 324 can then form a nitrogen-rich environment proximate to a surface of the silicon wafer 328 without forming silicon nitride (SiN), as discussed in more detail below with reference to FIG. 3C.

Figure 3C:
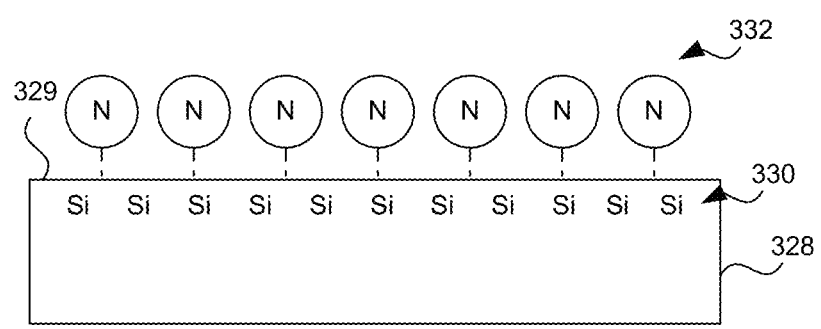
FIG. 3C is a cross-sectional diagram illustrating a portion of a substrate treated in the plasma reactor of FIG. 3B in accordance with embodiments of the technology.

FIG. 3C is a cross-sectional diagram illustrating a portion of the silicon wafer 328 processed in the plasma reactor 310 of FIG. 3B in accordance with embodiments of the technology. As shown in FIG. 3C, the silicon wafer 328 includes a plurality of silicon atoms 330 proximate to a surface 329 of the silicon wafer 328. Though not illustrated, the surface 329 may be oxygen terminated, hydroxyl terminated, and/or having other suitable termination groups.

A plurality of nitrogen atoms 332 can be adsorbed and/or otherwise attached to the surface 329 of the silicon wafer 328 via weak interactions. For example, the nitrogen atoms 332 may be attached to the surface 329 of the silicon wafer via Van der Waals forces or hydrogen bonds. Unlike prior art techniques, the nitrogen atoms 332 are not attached to the surface 329 of the silicon wafer 328 via covalent bonds, ionic bonds, and/or other strong interactions. As a result, the nitrogen atoms 332 do not form silicon nitride (SiN) on the surface 329 of the silicon wafer 328.

Figure 4A:
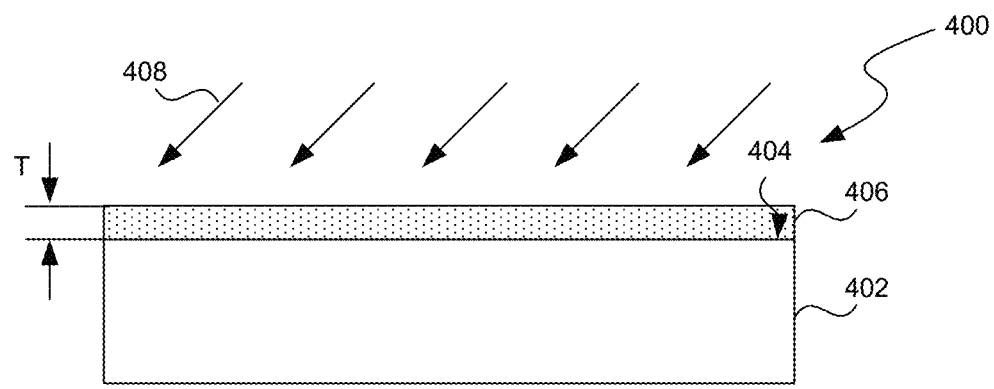
FIGS. 4A-4C are cross-sectional diagrams illustrating a portion of a substrate undergoing another procedure for generating a nitrogen-rich environment at a substrate surface in accordance with embodiments of the technology.
Figure 4B:
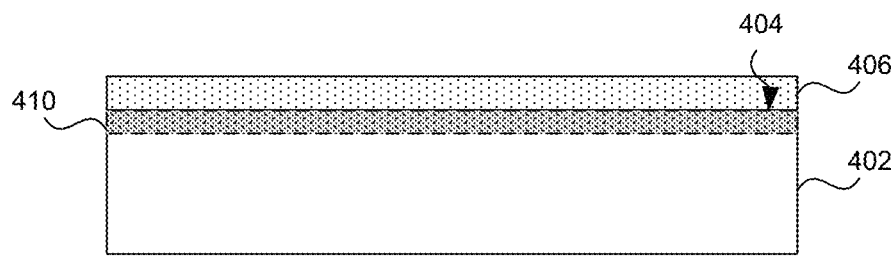
Figure 4C:
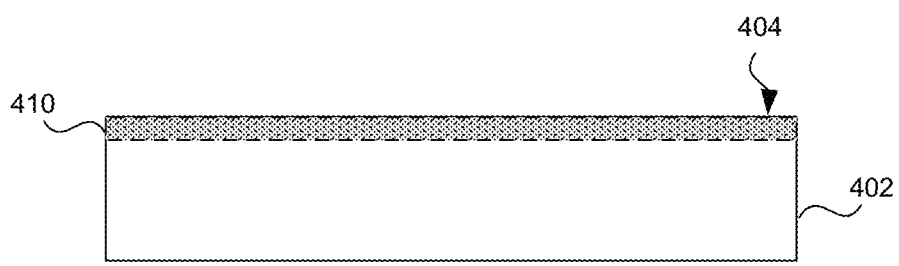

FIGS. 4A-4C are cross-sectional diagrams illustrating a portion of a substrate 402 undergoing a procedure 400 for generating a nitrogen-rich environment at least proximate a surface 404 in accordance with embodiments of the technology. As shown in FIG. 4A, an initial stage of the procedure 400 can include depositing a nitride material 406 on the surface 404 of the substrate 402. The nitride material 406 can include silicon nitride (SiN), aluminum nitride (AlN), and/or other suitable nitride materials with a thickness T. Techniques for depositing the nitride material 406 can include chemical vapor deposition (CVD), atomic layer deposition (ALD), MOCVD, MBE, and/or other suitable techniques. In one embodiment, the nitride material 406 may be generally amorphous. In other embodiments, the nitride material 406 may be partially crystalline.

A subsequent stage of the procedure 400 can include causing at least some of the nitrogen from the nitride material 406 to migrate toward the surface 404 of the substrate 402. In one embodiment, heat (as represented by the arrows 408) may be applied to facilitate the migration of nitrogen atoms. In other embodiments, electromagnetic radiation and/or other suitable techniques may be used to facilitate the migration of nitrogen atoms.

As shown in FIG. 4B, the migrated nitrogen atoms can form a nitrogen-rich layer 410 proximate to the surface 404 of the substrate 402. At least one operating parameter (e.g., an amount of heat, a radiation intensity, a duration of radiation and/or heat, etc.) may be adjusted so that the migrated nitrogen atoms do not form a nitrodized product with the substrate material. Instead, the migrated nitrogen atoms may be contained or trapped in the lattice structure of the substrate 402.

Another stage of the procedure 400 can include removing the nitride material 406 from the surface 404 of the substrate 402 prior to formation of LED structures on the surface 404 of the substrate 402. In one embodiment, removing the nitride material 406 can include wet etching the nitride material 406 and selecting at least one of an etching time, etching temperature, and etchant composition based on the thickness T of the nitride material 406. In other embodiments, removing the nitride material 406 can include laser ablation, dry etching, and/or using other suitable techniques. The procedure 400 can then include forming an LED structure on the substrate 402 with the nitrogen-rich layer 410 as discussed with reference to FIG. 2.

Figure 5:
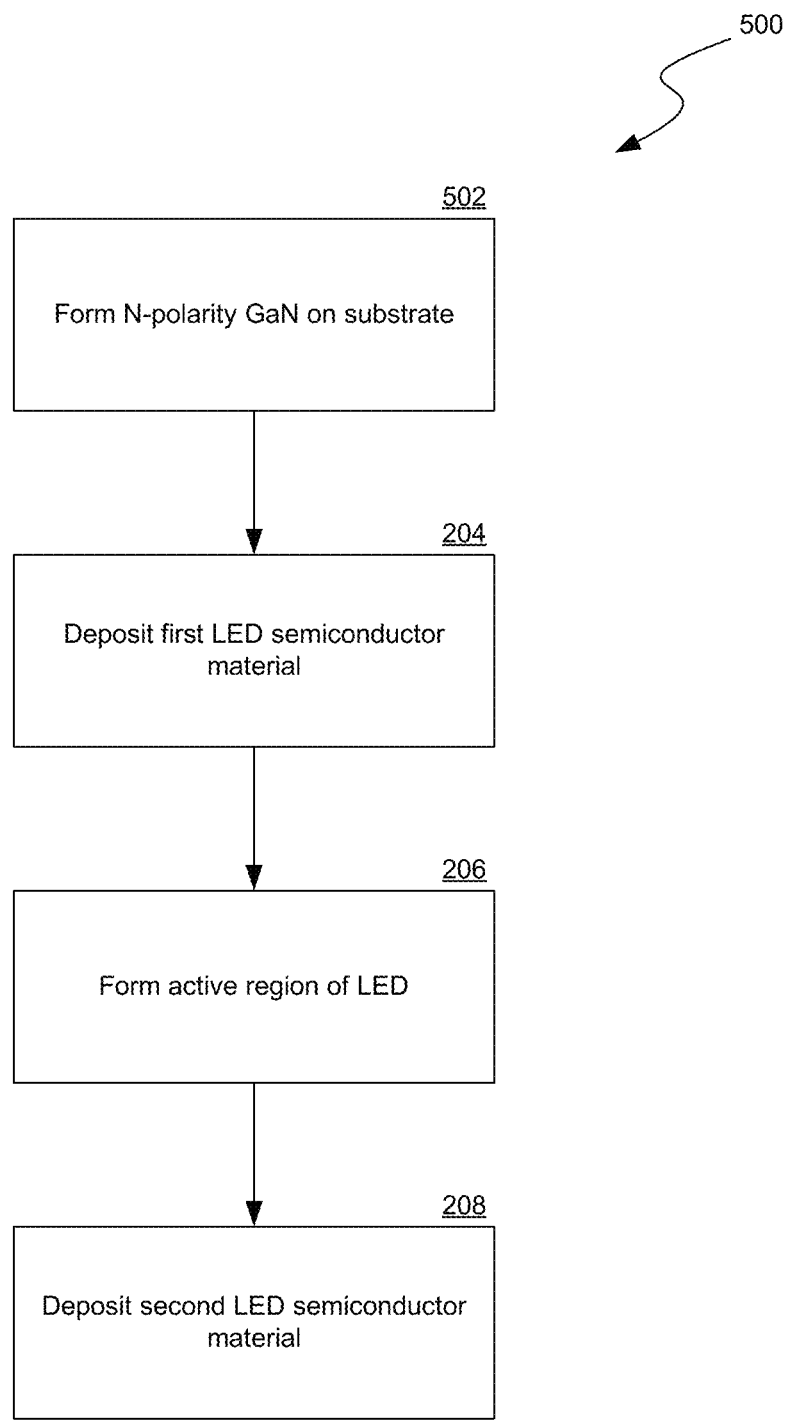
FIG. 5 is a flow diagram illustrating a method for forming an LED structure with N-polarity in accordance with further embodiments of the technology.

FIG. 5 is a flow diagram illustrating a method 500 for forming an LED structure with N-polarity in accordance with further embodiments of the technology. As shown in FIG. 5, an initial stage of the method 500 (block 502) can include forming an N-polarity GaN material on a substrate.

The substrate can include silicon (Si), silicon carbide (SiC), sapphire (Al$_2$O$_3$), and/or other suitable substrate materials.

In one embodiment, forming an N-polarity GaN material can include depositing GaN with heavy magnesium (Mg) doping onto the substrate via MOCVD, MEB, LPE, HVPE, and/or other suitable types of deposition techniques. Without being bound by theory, it is believed that when the magnesium doping concentration is above a threshold (e.g., about 1×E$^{20}$/cm$^{-3}$), the GaN formed on the substrate is substantially N-polarity. Thus, forming an N-polarity GaN material can also include adjusting at least one of the magnesium doping concentration, doping condition, and/or other suitable operation parameters to achieve a desired N-polarity lattice structure in the GaN material. In other embodiments, forming an N-polarity GaN material can also include depositing GaN with other types of suitable dopants. The method 500 can then include depositing a first LED semiconductor material, forming an active region of the LED, and depositing a second LED semiconductor material, as discussed in more detail above with reference to FIG. 2.

From the foregoing, it will be appreciated that specific embodiments of the technology have been described herein for purposes of illustration, but that various modifications may be made without deviating from the disclosure. For example, several embodiments of the procedure 300 may include forming at least some nitride material on the surface of the silicon wafer and subsequently removing the nitride material before forming the LED structure. In other examples, several embodiments of the procedures 300 and 400 may be performed in MOCVD, MEB, LPE, HVPE, and/or other suitable types of deposition systems. Many of the elements of one embodiment may be combined with other embodiments in addition to or in lieu of the elements of the other embodiments. For example, several embodiments of the procedure 300 may also include causing some of the nitrogen atoms to migrate toward the surface of the silicon wafer before removing the nitride material, as discussed with reference to FIGS. 4A-4C. Accordingly, the disclosure is not limited except as by the appended claims.

We claim:

1. A structure, comprising:
   a silicon substrate;
   a first semiconductor material directly on a surface of the substrate;
   an active region on the first semiconductor material, the active region having a nitrogen-polarity crystal structure; and
   a second semiconductor material on the active region;
   wherein the silicon substrate includes a silicon region adjacent the surface under the first semiconductor material, wherein the silicon region includes a plurality of nitrogen (N) atoms trapped in a silicon lattice structure thereof, and wherein the silicon region is substantially free of silicon nitrides.

2. The structure of claim 1 wherein:
   the silicon substrate is a silicon wafer having the lattice structure;
   the first semiconductor material includes an N-type gallium nitride (GaN) material;
   the active region includes an indium gallium nitride (InGaN) material;
   the second semiconductor material includes a P-type GaN material; and
   the silicon region is substantially free of silicon nitride (SiN) crystal structures.

3. The structure of claim 1 wherein:
   the silicon substrate is a silicon wafer;
   the first semiconductor material includes an N-type gallium nitride (GaN) material;
   the active region includes an indium gallium nitride (InGaN) material;
   the second semiconductor material includes a P-type GaN material; and
   the structure does not include crystalline silicon nitride (SiN) at an interface between the surface of the silicon wafer and the N-type GaN material.

4. The structure of claim 1 wherein:
   the silicon substrate is a silicon wafer;
   and the structure does not include crystalline silicon nitride (SiN) at an interface between the surface of the silicon wafer and the first semiconductor material.

5. A device, comprising:
   a silicon substrate material having a first major surface and an opposite second major surface;
   an active region carried by the silicon substrate material, wherein a distance between the first major surface of the silicon substrate material and the active region is less than a distance between the second major surface of the silicon substrate material and the active region;
   nitrogen atoms diffused into the silicon substrate material in a silicon region adjacent the first major surface of the silicon substrate material and under the active region, the silicon region being substantially free of silicon nitrides; and
   a nitrogen-polar material between the silicon substrate material and the active region.

6. The device of claim 5 wherein the silicon region is substantially free of silicon nitride (SiN) crystal structures.

7. The device of claim 5 wherein:
   the nitrogen-polar material includes a first semiconductor material directly adjacent to a first side of the active region;
   the device further comprises a second semiconductor material directly adjacent to a second side of the active region opposite to the first side of the active region;
   the first semiconductor material is one of a P-type semiconductor material and an N-type semiconductor material; and
   the second semiconductor material is the other of the P-type semiconductor material and the N-type semiconductor material.

8. The device of claim 7 wherein the N-type semiconductor material is N-type gallium nitride.

9. The device of claim 7 wherein the P-type semiconductor material is P-type gallium nitride.

10. The device of claim 7 wherein the first semiconductor material is directly adjacent to the silicon substrate material.

11. The device of claim 7 wherein the nitrogen-polar material includes a buffer material between the substrate material and the first semiconductor material.

* * * * *